(12) United States Patent
Bechtel et al.

(10) Patent No.: US 7,642,714 B2
(45) Date of Patent: Jan. 5, 2010

(54) ELECTROLUMINESCENT DEVICE WITH A TRANSPARENT CATHODE

(75) Inventors: Helmut Bechtel, Roetgen (DE); Wolfgang Busselt, Roetgen (DE); Herbert Friedrich Börner, Aachen (DE); Dietrich Bertram, Aachen (DE)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/518,846

(22) PCT Filed: Jun. 19, 2003

(86) PCT No.: PCT/IB03/02905

§ 371 (c)(1), (2), (4) Date: Dec. 7, 2005

(87) PCT Pub. No.: WO2004/004421

PCT Pub. Date: Jan. 8, 2004

(65) Prior Publication Data

US 2006/0103321 A1    May 18, 2006

(30) Foreign Application Priority Data

Jun. 28, 2002    (DE) .................................. 102 28 939

(51) Int. Cl.
*H01J 33/04*   (2006.01)
(52) U.S. Cl. ........................................ 313/509; 313/506
(58) Field of Classification Search ......... 313/498–512; 428/690
See application file for complete search history.

(56) References Cited

U.S. PATENT DOCUMENTS

| 4,434,010 | A | * | 2/1984 | Ash ........................... 106/415 |
| 5,337,191 | A | * | 8/1994 | Austin ....................... 359/885 |
| 5,674,636 | A | * | 10/1997 | Dodabalapur et al. ...... 428/690 |
| 5,831,375 | A | * | 11/1998 | Benson, Jr. ................ 313/110 |
| 6,278,237 | B1 | * | 8/2001 | Campos ..................... 313/512 |
| 6,406,801 | B1 | * | 6/2002 | Tokito et al. ............... 428/690 |
| 6,861,800 | B2 | * | 3/2005 | Tyan et al. ................. 313/506 |
| 6,888,305 | B2 | * | 5/2005 | Weaver ...................... 313/506 |
| 2001/0017517 | A1 | * | 8/2001 | Yamazaki .................. 313/504 |
| 2001/0044035 | A1 | * | 11/2001 | Morii ........................ 428/690 |
| 2004/0140757 | A1 | * | 7/2004 | Tyan et al. ................. 313/504 |

FOREIGN PATENT DOCUMENTS

| EP | 1076368 A1 | 2/2001 |
| EP | 1119221 A2 | 7/2001 |
| EP | 1119221 B1 | 7/2001 |

OTHER PUBLICATIONS

Jordan R.H.; Rothberg, L.J.; Dodabalapur, A.; and Slusher, R.E.; "Efficiency enhancement of microcavity organic light emitting diodes," Applied Physics Letters 69 (14), Sep. 30, 1996 pp. 1997-1999.*

R. J. Visser: Application of Polymer Light-Emitting Materials in Light-Emitting Diodes, Backlights and Displays, Philips Journal of Research, vol. 51, No. 4, 1998, pp. 467-477.

* cited by examiner

*Primary Examiner*—Nimeshkumar D. Patel
*Assistant Examiner*—Anne M Hines

(57) ABSTRACT

An electroluminescent device includes a transparent cathode and a substrate. A laminated body is provided Adjacent to the substrate. The laminated body includes a first electrode, an electroluminescent layer and a second metallic electrode. The second electrode is covered with transparent dielectric layers which increase the transmission of light through the second metallic electrode and serve as filters.

19 Claims, 3 Drawing Sheets

ELECTROLUMINESCENT DEVICE WITH A TRANSPARENT CATHODE

The invention relates to an electroluminescent device comprising a substrate and a laminated body composed of a first electrode, an electroluminescent layer and a second electrode.

Various embodiments of electronically driven display systems based on different principles are known and in widespread use.

In accordance with one of said principles use is made of organic light-emitting diodes, so-termed OLEDs, as the light source. Organic light-emitting diodes are built up of a plurality of function layers. In "Philips Journal of Research, 1998, 51, 467", a description is given of a typical structure of an OLED. A typical structure comprises an ITO (indium tin oxide) layer as the transparent electrode (anode), a conductive polymer layer, an electroluminescent layer, i.e. a layer of a light-emissive material, in particular a light-emissive polymer, and an electrode of a metal, preferably a metal having a low work function, (cathode). Such a structure is usually provided on a substrate, generally glass. The light generated reaches the viewer through the substrate. An OLED comprising a light-emissive polymer in the electroluminescent layer is also referred to as a polyLED or PLED.

At present, the majority of the OLEDs are passively driven. However, this is possible only in the case of small display screen diagonals. To operate larger display systems it is necessary, for efficiency reasons, to switch over to active-matrix operation. In an active OLED the first electrode is structured so as to be pixel-shaped, and each pixel electrode is driven separately. To actively drive an OLED at least two thin-film transistors and one capacitor for each pixel electrode are necessary. As a result of the space requirement of the components necessary to drive the pixel electrodes, OLEDs have been developed such that the transistors and capacitors are provided on the substrate, and the light leaves the electroluminescent device through a transparent cathode. Such an electroluminescent device is described, for example, in "13-inch Full Color Organic EL Display", Kaizen Flash 2001.

For efficiency reasons, only metals can suitably be used as the cathode materials. To obtain a sufficiently high conducting power of the metal layer, a layer thickness in the range of 10 to 30 nm is necessary, which leads to a low transmission of the light generated in the electroluminescent device.

Therefore, it is an object of the present invention to provide an improved electroluminescent device with a cathode exhibiting a high transmission of the light emitted by the electroluminescent layer.

Color electroluminescent devices often require the use of a filter, in particular a color filter. It is desirable that the manufacture of the color filter can be readily integrated in the manufacturing process of the electroluminescent device.

Therefore, it is a further object of the present invention to provide an improved electroluminescent device with a filter, in particular a color filter.

These objects are achieved by an electroluminescent device comprising a substrate and, adjacent to said substrate, a laminated body composed of a first electrode, an electroluminescent layer, a second electrode and 2n+1 transparent dielectric layers, where n=0, 1, 2, 3 . . . α, the transparent dielectric layers alternately have a high refractive index of n>1.7 and a low refractive index of n≦1.7, and the transparent dielectric layer bordering on the second electrode has a high refractive index of n>1.7.

As the transparent, dielectric layer bordering on the second electrode has a high refractive index n, the reflection of the light generated by the electroluminescent layer is reduced at the second metallic electrode and more light passes through the second electrode. By means of the further transparent dielectric layers, a filtering effect in accordance with Bragg's principle is generated. Thus, the transmission properties can be adapted to the emission spectrum of the light generated. In addition, the filtering effect of the transparent, dielectric layers enables the emission color of the electroluminescent device to be varied in a simple manner, or it enables a color filter structure for color electroluminescent devices to be generated. The actual manufacturing process of the electroluminescent device remains unchanged because the transparent dielectric layers are provided only at the end of the process.

These and other aspects of the invention will be apparent from and elucidated with reference to five Figures and four examples.

Figure 1:
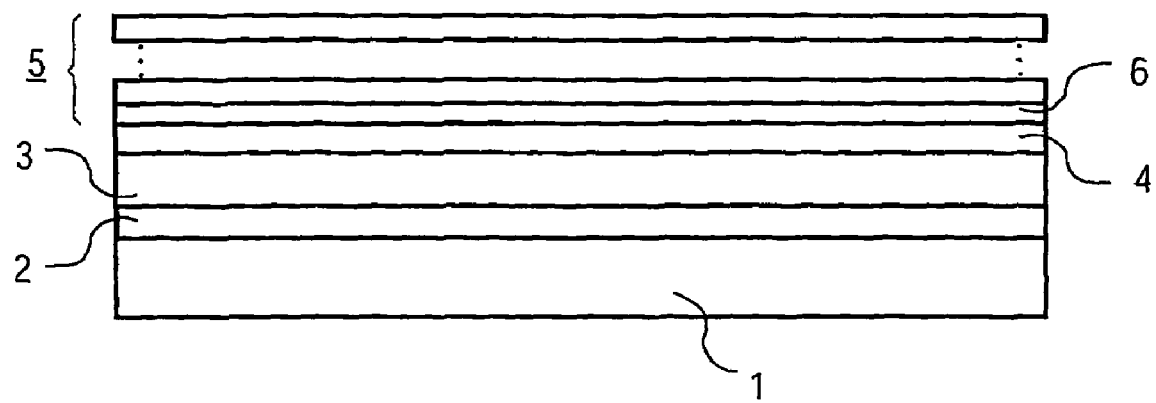
FIG. 1 is a cross-sectional view of an electroluminescent device.

In accordance with FIG. 1, an electroluminescent device comprises a substrate 1, for example a glass plate, a polymer foil, a semiconductor or a ceramic wafer. Dependent upon the material used, said substrate 1 is light-transmitting or opaque. If the electroluminescent device is actively driven, then active and passive components, such as transistors and capacitors, are situated in or on the substrate 1.

On the substrate 1 there is provided a first electrode 2 that serves as an anode. Said electrode 2 may contain, for example, p-doped silicon or indium-doped tin oxide (ITO). An isolating layer may be situated between the substrate 1 and the first electrode 2.

An electroluminescent layer 3 is provided on the first electrode 2. Said electroluminescent layer 3 contains either a light-emitting polymer or small, organic molecules. Dependent upon the material type used in the electroluminescent layer 3, the devices are referred to as LEPs (Light Emitting Polymers) or also as polyLEDs, or as SMOLEDs (Small Molecule Organic Light Emitting Diodes). The electroluminescent layer 3 preferably contains a light-emitting polymer. Said light-emitting polymer may be, for example, poly(p-phenylene vinylene) (PPV) or a substituted PPV, such as dialkoxy-substituted PPV.

The second electrode 4, which borders on the electroluminescent layer 3, may contain, for example, a metal such as aluminum, copper, silver or gold, or an alloy. It may be preferred that the second electrode 4 comprises two or more conductive layers. It may be particularly preferred that the second electrode 4 comprises a first layer, which borders on the electroluminescent layer 3 and is composed of an alkaline earth metal, such as calcium or barium, and a second layer of aluminum, copper, silver or gold.

In the case of a passively driven electroluminescent device, the electrodes 2, 4 are provided such that they form a two-dimensional array. In the case of an actively driven electroluminescent device, the first electrode 2 is structured so as to be pixel-shaped, and each pixel electrode is separately driven.

Alternatively, the laminated body may comprise additional layers such as a hole-transporting layer and/or an electron-transporting layer. A hole-transporting layer is arranged between the first electrode 2 and the electroluminescent layer 3. An electron-transporting layer is situated between the second electrode 4 and the electroluminescent layer 3. Both layers preferably contain conductive polymers.

The electroluminescent layer 3 may be divided into a plurality of color pixels emitting light in the colors red, green and blue. To generate colored light, the material in the electroluminescent layer 3 may be doped with fluorescent dyes, or a polymer emitting colored light is used as the material in the electroluminescent layer 3. In a different embodiment, a polymer is used in the electroluminescent layer 3, which polymer emits light in a broad wavelength range, and a color filter is used to generate, from this light, light in any one of the three primary colors red, green or blue.

On the second electrode 4 a number of transparent dielectric layers 5 is provided equal to 2n+1, where n=0, 1, 2, 3 . . . α. Said transparent dielectric layers 5 alternately have a high refractive index of n>1.7 and a low refractive index of n≦1.7. The first transparent, dielectric layer 6, which borders on the second electrode 4, has a high refractive index of n>1.7.

The reflection of the light emitted by the electroluminescent layer 3 at the metallic, second electrode 4 is reduced by the first transparent, dielectric layer 6 and hence the transmission of the light through the second electrode 4 is increased.

By means of the further, transparent, dielectric layers, the transmission property of the second electrode 4 can be adapted to the emission spectrum of the light emitted by the electroluminescent layer 3. By the variation of the refractive index in the layer sequence, a filter in accordance with Bragg's principle is generated.

The transparent, dielectric layers having a high refractive index, i.e. a refractive index of n>1.7, may contain inorganic materials, such as ZnS, $TiO_2$ or $SnO_2$, or organic materials. Preferably, the transparent, dielectric layers having a high refractive index contain ZnS.

The transparent, dielectric layers having a low refractive index, i.e. a refractive index of n≦1.7, may contain, for example, inorganic materials, such as $SiO_2$ or $MgF_2$, or organic materials. Preferably, the transparent, dielectric layers having a low refractive index contain $MgF_2$.

By applying a suitable voltage of, typically, a few volts to the electrodes 2, 4, positive and negative charge carriers are injected, which migrate to the electroluminescent layer 3 where they recombine, thereby generating light. In the case of a light-transmitting substrate 1, said light is emitted, on the one hand, by the first electrode 2 and the substrate 1 and, on the other hand, by the second electrode 4 and the transparent, dielectric layers 5. If the substrate 1 is opaque, then light is emitted only by the second electrode 4 and the transparent, dielectric layers 5.

Figure 2:
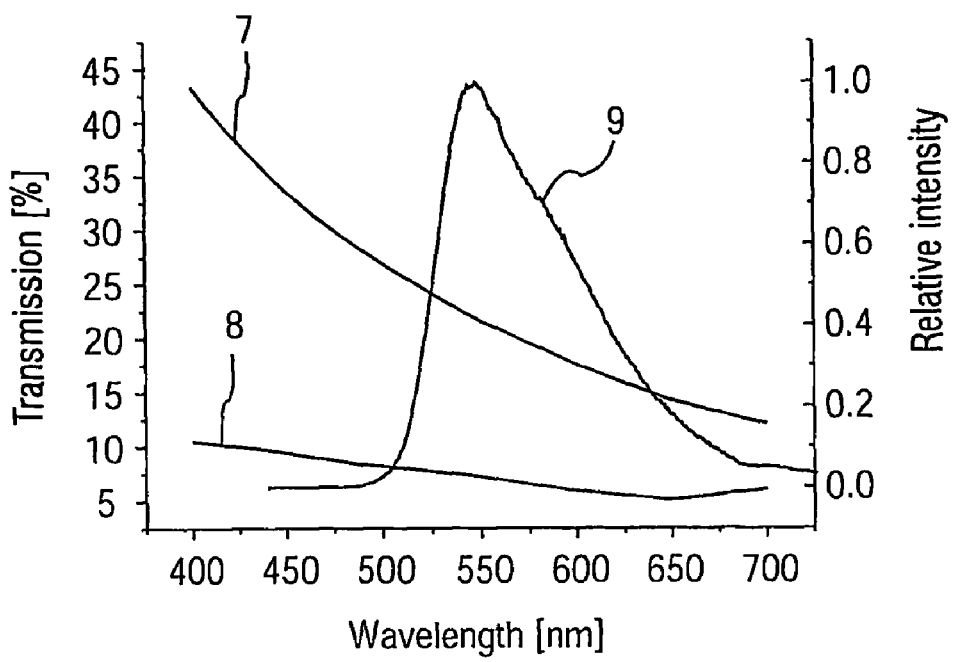
FIG. 2 shows the transmission curves of two conventional electrodes.

FIG. 2 shows the transmission curves 7, 8 of two conventional electrodes and the emission spectrum 9 of an electroluminescent device comprising a 140 nm thick ITO layer as the first electrode, a 200 nm thick layer of polyethylene dioxythiophene (PDOT) as the hole-transporting layer, a 80 nm thick layer of PPV as the electroluminescent layer, and a 5 nm thick Ba layer and a 200 nm thick Al layer as the second electrode. Curve 7 shows the transmission of an electrode comprising a 5 nm thick Ba layer and a 25 nm thick Ag layer. Curve 8 shows the transmission of an electrode comprising a 5 nm thick Ba layer and a 15 nm thick Al layer.

Figure 3:
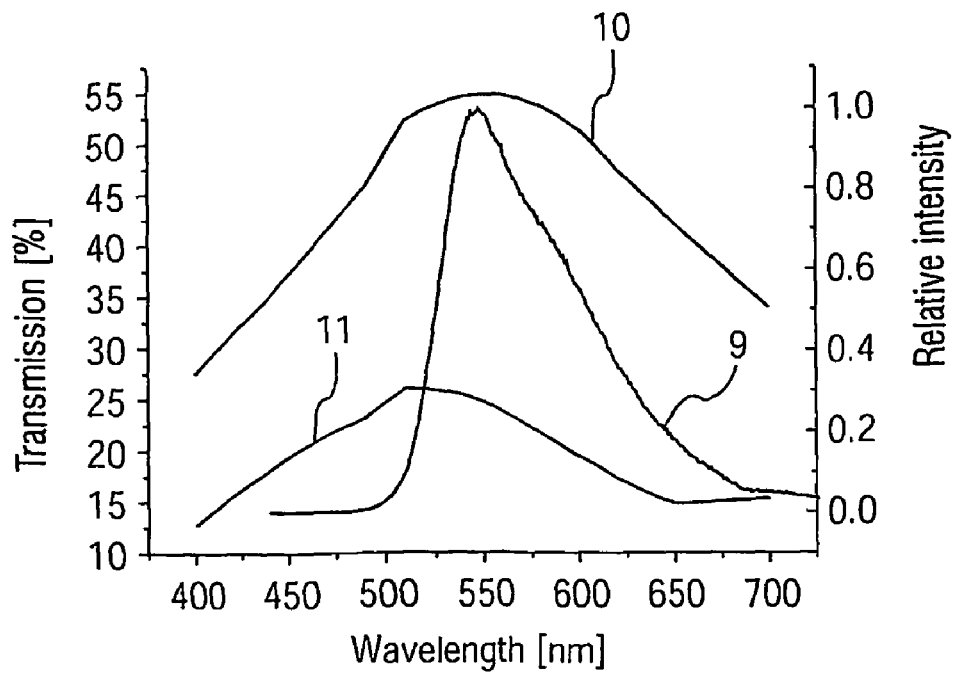
FIG. 3 shows the transmission curves of two electrodes covered with a transparent layer.

FIG. 3 shows the transmission curves 10, 11 of two electrodes covered with a transparent dielectric layer of ZnS. Curve 10 shows the transmission of an electrode which comprises a 5 nm thick Ba layer and a 25 nm Ag layer and which is covered with a 38 nm thick ZnS layer. Curve 11 shows the transmission of an electrode which comprises a 5 nm thick Ba layer and a 15 nm thick Al layer and which is covered with a 43 nm thick ZnS layer. The emission spectrum 9 that is also shown in the drawing is identical to that shown in FIG. 2.

FIG. 3 shows that, in both cases, the adjoining, transparent, dielectric layer causes the transmission of the light emitted by the electroluminescent layer 3 through the metallic electrode to be substantially increased.

In addition, the transmission in the blue spectral region is reduced. This filtering effect, particularly in conjunction with a circular polarizer, enables the daylight contrast to be increased.

Figure 4:
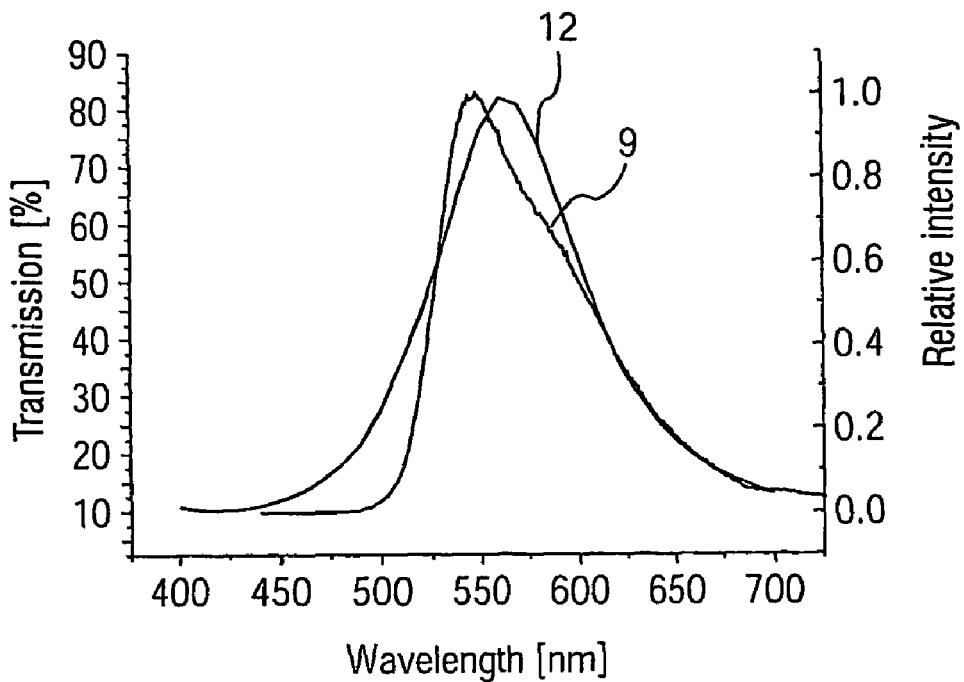
FIG. 4 shows the transmission curve of an electrode which is covered with three transparent, dielectric layers.

FIG. 4 shows the transmission curve of an electrode which is covered with three transparent, dielectric layers 5 of ZnS and $MgF_2$. Curve 12 shows the transmission of an electrode which comprises a 5 nm thick Ba layer and a 25 nm thick Ag layer and which is covered with a layer sequence of a 41 nm thick ZnS layer, a 84 nm thick $MgF_2$ layer and a 55 nm thick ZnS layer. In this case, the 41 nm thick layer of ZnS borders on the electrode. The emission spectrum 9 that is also shown in FIG. 4 is identical to the emission spectrum 9 shown in FIG. 2.

As becomes apparent from FIG. 4, three transparent, dielectric layers are sufficient to attain a transmission of visible light through the metallic electrode of up to 80%. Furthermore, the transmission curve is adapted to the emission spectrum of the light generated, such that the transmission maximum of the electrode lies in the range of the emission maximum of PPV. This results, in addition, in a filter effect by the transparent, dielectric layers 5. In this manner, for example, the emission color of the electroluminescent device can be varied.

Figure 5:
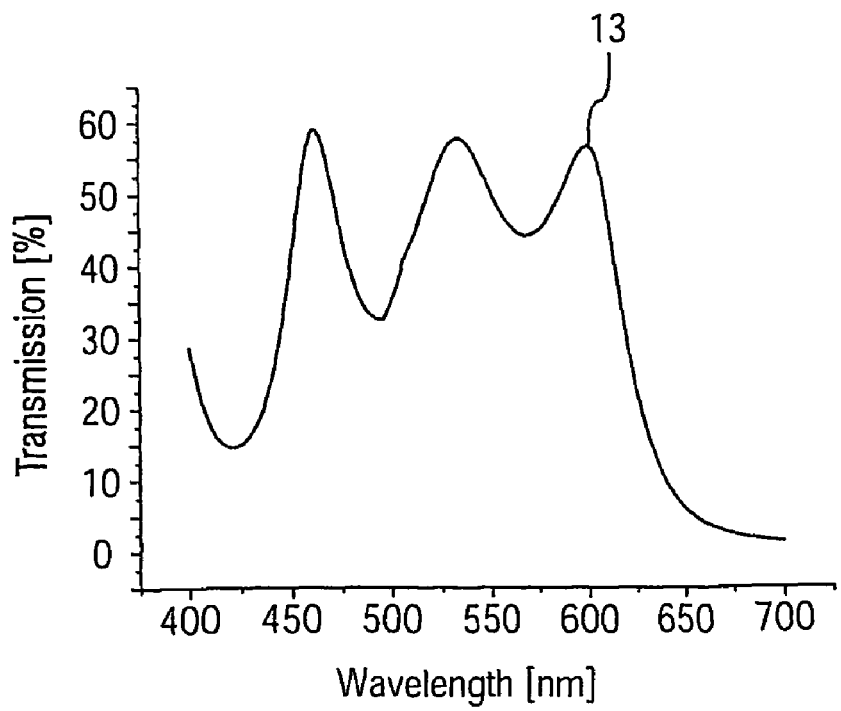
FIG. 5 shows the transmission curve of an electrode which is covered with seven transparent, dielectric layers.

FIG. 5 shows the transmission curve of an electrode which is covered with seven transparent, dielectric layers of ZnS and $MgF_2$. Curve 13 shows the transmission of an electrode which comprises a 5 nm thick Ba layer and a 25 nm thick Ag layer, and which is covered with a layer sequence of a 9 nm thick ZnS layer, a 135 nm thick $MgF_2$ layer, a 62 nm thick ZnS layer, a 160 nm thick $MgF_2$ layer, a 64 nm thick ZnS layer, a 133 nm thick $MgF_2$ layer and a 102 nm thick ZnS layer. The 9 nm thick ZnS layer borders on the electrode.

As becomes apparent from FIG. 5, by means of seven transparent, dielectric layers, a transmission curve can be generated whose maximum transmission peaks lie in the wavelength ranges of the three primary colors red, green and blue.

In this embodiment a color filter is obtained by means of the transparent, dielectric layers 5.

Further transparent, dielectric layers enable the width of the transmission peaks to be set to smaller values.

Next, embodiments of the invention will be explained which constitute examples of possible implementations.

EXAMPLE 1

On a glass plate, which served as the substrate 1, there was provided a 140 nm thick layer of ITO as the first electrode 2, which was subsequently structured. Next, successively a 200 nm thick layer of polyethylene dioxythiophene (PDOT) as the hole-conducting layer and a 80 nm thick layer of poly(p-phenylene vinylene) (PPV) as the electroluminescent layer 3 were provided. The second electrode 4 composed of a 5 nm thick layer of Ba and a 15 nm thick layer of Al was provided on the PPV layer. A 43 nm thick layer of ZnS was deposited on the layer of Al.

The transmission properties of the second electrode 4 are shown in curve 11 of FIG. 3. The transmission of light, generated in the electroluminescent layer 3, through the second electrode 4 could be increased in comparison with an uncoated electrode (curve 8 in FIG. 2). In addition, the transmission in the blue spectral region is reduced.

EXAMPLE 2

An electroluminescent device similar to that in example 1 was manufactured, with the exception that the second electrode contained a 25 nm thick layer of Ag instead of the layer of Al, and the layer of ZnS had a thickness of 38 nm.

The transmission properties of the second electrode 4 regarding light emitted by the electroluminescent layer 3 are shown in curve 10 of FIG. 3. In comparison with an uncoated electrode (curve 7 in FIG. 2), the transmission could be increased. In addition, a filtering effect in the blue and red spectral regions was maintained.

EXAMPLE 3

An electroluminescent device similar to that described in example 2 was manufactured, with the exception that three transparent, dielectric layers 5 were deposited on the second electrode 4. The first transparent, dielectric layer 6 of ZnS, which borders on the second electrode 4, had a layer thickness of 41 nm, the second transparent, dielectric layer of $MgF_2$ had a layer thickness of 84 nm, and the third transparent, dielectric layer of ZnS had a layer thickness of 55 nm.

The transmission properties of the second electrode 4 are shown in curve 12 of FIG. 4. In comparison with a singly coated electrode (curve 10 in FIG. 3), the transmission properties could be adapted to the emission spectrum (see curve 9 in FIG. 4) of an electroluminescent layer of PPV.

EXAMPLE 4

An electroluminescent device similar to that of example 2 was manufactured, with the exception that seven transparent, dielectric layers 5 were deposited on the second electrode 4. The first transparent, dielectric layer 6 of ZnS, which borders on the second electrode 4, had a layer thickness of 9 nm, the second transparent, dielectric layer of $MgF_2$ had a layer thickness of 134 nm, the third transparent, dielectric layer of ZnS had a layer thickness of 62 nm, the fourth transparent, dielectric layer of $MgF_2$ had a layer thickness of 166 nm, the fifth transparent, dielectric layer of ZnS had a layer thickness of 64 nm, the sixth transparent, dielectric layer of $MgF_2$ had a layer thickness of 133 nm and the seventh transparent, dielectric layer of ZnS had a layer thickness of 102 nm.

The transmission properties of the second electrode 4 are shown in curve 13 of FIG. 4. The maximum transmission values lie in the wavelength ranges of the three primary colors red, green and blue. The electroluminescent device exhibits not only an increased transmission to light generated by the electroluminescent layer 3, but also a color filter for the three primary colors.

The invention claimed is:

1. An electroluminescent device comprising a substrate and, adjacent to said substrate, a laminated body composed of an anode electrode directly on said substrate, an electroluminescent layer directly on said anode electrode, a cathode electrode directly on said electroluminescent layer, and 2n+1 transparent dielectric layers directly on said cathode electrode so that the 2n+1 transparent dielectric layers are located on an opposite side of said substrate, where n is an integer value greater than or equal to 3, which transparent dielectric layers alternately have a high refractive index with a refractive index greater than 1.7 and a low refractive index with a refractive index less than or equal to 1.7, and the transparent dielectric layer bordering on the cathode electrode has a high refractive index of n>1.7, whereby reflection of light emitted by the electroluminescent layer at the cathode electrode is reduced by the transparent dielectric layer and transmission of light through the cathode electrode is increased; wherein the 2n+1 transparent dielectric layers comprise seven layers including four layers having the high refractive index and three layers having the low refractive index to generate light having three transmission peaks that lie in wavelength ranges of red, green and blue colors, and wherein the four layers have an increasing layer thickness starting from a first layer bordering on the cathode electrode.

2. The electroluminescent device as claimed in claim 1, wherein the transparent layers having the low refractive index comprise $MgF_2$.

3. The electroluminescent device of claim 1, wherein the transparent layers having the high refractive index comprise $SnO_2$.

4. The electroluminescent device of claim 1, wherein a second layer of the three layers has a largest thickness among the three layers.

5. The electroluminescent device of claim 1, wherein a second layer of the three layers has a largest thickness among the seven layers.

6. An electroluminescent device comprising:
a substrate at a first side of the electroluminescent device;
a first electrode formed on the substrate;
an electroluminescent layer formed on the first electrode;
a second electrode formed on the electroluminescent layer; and
2n+1 transparent dielectric layers formed on the second electrode so that the 2n+1 transparent dielectric layers are located at a second side of the electroluminescent device, the second side being opposite the first side, where n is an integer value greater than or equal to 3, the transparent dielectric layers alternately having a high refractive index with a refractive index greater than 1.7 and a low refractive index with a refractive index less than or equal to 1.7, wherein a first transparent dielectric layer bordering on the second electrode has the high refractive index of n>1.7;
wherein the 2n+1 transparent dielectric layers comprise seven layers including four layers having the high refractive index and three layers having the low refractive index to generate light having three transmission peaks that lie in wavelength ranges of red, green and blue colors, and wherein the four layers have an increasing layer thickness starting from a first layer bordering on the second electrode.

7. The electroluminescent device of claim 6, wherein the transparent layers having the low refractive index comprise $MgF_2$.

8. The electroluminescent device of claim 6, wherein the first transparent dielectric layer is configured to reduce reflection of light generated by the electroluminescent layer at the second electrode so that more light passes through the second electrode.

9. The electroluminescent device of claim 6, wherein the 2n+1 transparent dielectric layers are configured to increase transmission of light generated in the electroluminescent layer through the second electrode.

10. The electroluminescent device of claim 6, wherein the 2n+1 transparent dielectric layers are configured to vary color of light emitted from the electroluminescent device.

11. The electroluminescent device of claim 6, wherein the 2n+1 transparent dielectric layers are configured to form a color filter.

12. The electroluminescent device of claim 6, wherein the 2n+1 transparent dielectric layers are configured to reduce a width of a transmission peak of light emitted from the electroluminescent device.

13. The electroluminescent device of claim 6, wherein the electroluminescent layer is divided into a plurality of color pixels.

14. The electroluminescent device of claim 6, wherein the second electrode comprises a first layer which borders on the electroluminescent layer and a second layer formed over the first layer, the first layer including an alkaline earth metal, and the second layer including copper.

15. The electroluminescent device of claim 14, wherein the alkaline earth metal is barium.

16. The electroluminescent device of claim 6, further comprising only a single isolating layer situated between the substrate and the first electrode.

17. The electroluminescent device of claim 6, wherein the transparent layers having the high refractive index comprise $SnO_2$.

18. The electroluminescent device of claim 6, wherein a second layer of the three layers has a largest thickness among the three layers.

19. The electroluminescent device of claim 6, wherein a second layer of the three layers has a largest thickness among the seven layers.

* * * * *